United States Patent
Kajiya et al.

(10) Patent No.: US 7,034,993 B2
(45) Date of Patent: Apr. 25, 2006

(54) OPTICAL AMPLIFIER APPARATUS

(75) Inventors: Satoshi Kajiya, Tokyo (JP); Katsuhiro Shimizu, Tokyo (JP); Takahiko Itoh, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/147,366

(22) Filed: Jun. 8, 2005

(65) Prior Publication Data

US 2005/0225844 A1    Oct. 13, 2005

Related U.S. Application Data

(62) Division of application No. 10/069,487, filed as application No. PCT/JP01/05416 on Jun. 25, 2001.

(30) Foreign Application Priority Data

Jun. 29, 2000  (JP) .............................. 2000-197135

(51) Int. Cl.
*H01S 3/00* (2006.01)
(52) U.S. Cl. .................. 359/337.13; 359/337.4
(58) Field of Classification Search ............. 359/337.1, 359/337.13, 337.4
See application file for complete search history.

(56) References Cited

U.S. PATENT DOCUMENTS

| | | |
|---|---|---|
| 5,812,710 A | 9/1998 | Sugaya |
| 5,818,629 A | 10/1998 | Kinoshita |
| 6,023,366 A | 2/2000 | Kinoshita |
| 6,055,092 A | 4/2000 | Sugaya et al. |
| 6,172,803 B1 | 1/2001 | Masuda et al. |
| 6,215,584 B1 * | 4/2001 | Yang et al. ............... 359/337.4 |
| 6,535,330 B1 * | 3/2003 | Lelic et al. ............ 359/337.13 |
| 6,603,596 B1 * | 8/2003 | Inagaki et al. ........... 359/341.4 |

FOREIGN PATENT DOCUMENTS

| | | |
|---|---|---|
| EP | 1 058 413 A2 | 12/2000 |
| EP | 1 296 423 A1 | 3/2003 |
| JP | 6-45682 A | 2/1994 |
| JP | 7-64134 A | 3/1995 |
| JP | 8-248455 A | 9/1996 |
| JP | 8-278523 A | 10/1996 |
| JP | 9-159526 A | 6/1997 |
| JP | 9-185091 A | 7/1997 |
| JP | 9-211507 A | 8/1997 |
| JP | 9-321701 A | 12/1997 |
| JP | 10-65650 A | 3/1998 |
| JP | 10-294510 A | 11/1998 |
| JP | 11-501164 A | 1/1999 |
| JP | 9-11926 A1 | 4/1999 |
| WO | WO 02/080378 A2 * | 10/2002 |

\* cited by examiner

*Primary Examiner*—Mark Hellner
(74) *Attorney, Agent, or Firm*—Birch, Stewart, Kolasch & Birch, LLP

(57) ABSTRACT

The optical amplifier apparatus comprises an optical amplifier which amplifies an input signal light, an output detecting unit which detects an output level of the optical amplifier, an output control unit which controls an output level of the optical amplifier according to an output level detected by the output detecting unit, a gain inclination detecting unit which detects a gain inclination relating to a wavelength of the optical amplifier, and a gain inclination control unit which controls a gain inclination of the optical amplifier according to a gain inclination detected by the gain inclination detecting unit.

5 Claims, 17 Drawing Sheets

OPTICAL AMPLIFIER APPARATUS

This application is a Divisional of application Ser. No. 10/069,487, filed on Apr. 25, 2002, which is the national phase under 35 U.S.C. § 371 of PCT International Application No. PCT/JP01/05416 which has an International filing date of Jun. 25, 2001, which designated the United States of America, the entire contents of which are hereby incorporated by reference and for which priority is claimed under 35 U.S.C. § 120.

BACKGROUND OF THE INVENTION

1. Technical Field

The present invention relates to an optical amplifier apparatus. More particularly, this invention relates to the optical amplifier apparatus which is utilized for an optical repeater and others for wavelength multiplex transmission.

2. Background Art

In recent years, along the rapid increase in demand for communications using the Internet and the like, there have been actively progressed researches and developments into and practical application of large-capacity and high-speed transmission systems in networks. As one of such signal transmission systems, a wavelength multiplex transmission system for transmitting signals by multiplexing signal lights of a plurality of mutually different wavelengths through one transmission fiber has been known. According to signal transmission based on the wavelength multiplex transmission system, it is possible to transmit information for each signal of each wavelength, and this system is suitable for large-capacity transmission. An optical fiber amplifier (an optical amplifier) constructed of a rare-earth-added optical fiber has the following characteristics, and is suitable for application to wavelength multiplex transmission. The amplifier does not depend on a transmission speed, the amplifier can simplify repeaters, and the amplifier collectively amplifies all input signal lights.

However, the optical amplifier has gain wavelength dependency, and it has been known that there occurs a variance between wavelengths in the light output or the gain of each wavelength after the amplification. Therefore, there occurs a variance between wavelengths in the optical power after the transmission. Particularly, when carrying out a multi-stage repeating by the optical amplifier, the variance between wavelengths due to the optical amplifier at each repeating stage is accumulated. This brings about the inconvenience that the variance between wavelengths of the optical power after the transmission becomes larger.

As an example of an optical amplifier gain equalization technique for solving the above problem, there is a technique (an optical equalization amplifier) as disclosed in Japanese Patent Application Laid-open No. 9-211507. This optical equalization amplifier is an apparatus for equalizing the output levels of a plurality of wavelength components as well as making constant the light input and output levels, in the amplification of wavelength-multiplexed lights. As shown in FIG. 17, the optical equalization amplifier has an optical amplifier 103 and a variable optical attenuator 104 arranged between an input terminal 101 and an output terminal 102.

The optical amplifier 103 has such gain inclination characteristics, that a gain at a long wavelength side becomes smaller when the excitation ratio is high, and that a gain at a short wavelength side becomes smaller when the excitation ratio is low. In other words, the optical amplifier 103 has a negative inclination of gain relative to wavelength when the excitation ratio is high, and has a positive inclination of gain relative to wavelength when the excitation ratio is low. As an example of a means which changes the excitation ratio, there are an excitation power control unit, and an optical level control unit for controlling a signal light that is input to the amplifier.

In the above optical amplifier apparatus, an input wavelength-multiplexed signal is amplified by the optical amplifier 103. A level of each wavelength is detected at the output side of the optical amplifier 103. The optical amplifier apparatus controls the excitation power (gain control) of the optical amplifier 103 so that the levels (gains) of the wavelengths are equalized. An output level is detected at the output side of the variable optical attenuator 104. The optical amplifier apparatus controls (output control) the attenuation of the output signal light of the variable optical attenuator 104.

However, a transmission line and a passive device have wavelength dependency attenuation, and therefore, optical signals of different levels are received at the input of the optical amplifier. This brings about a variance in the optical levels between the wavelengths. A variance of optical levels generated by one optical amplifier is small. However, as dozens to hundreds of optical amplifiers are provided for long-distance transmission like a submarine cable that connects between continents, the accumulation of such variances results in a small optical level in a channel of a specific signal wavelength. This has a risk of deteriorating an optical signal to noise ratio.

As the wavelength signal of the lowest power among the multiplexed wavelengths becomes a lower limit of reception power after the transmission, a maximum transmission distance is limited by the wavelength signal of the lowest power. Therefore, it is important to lower the variance between wavelengths after the transmission, in order to expand the maximum repetition transmission distance. For minimizing the variance in the optical signal to noise ratio between channels after the transmission and minimizing the variance in the reception characteristics, there is a technique of providing a gain inclination at the transmission side in advance (pre-emphasizing). An inline automatic gain inclination compensator may be inserted into the transmission line.

However, the provision of a large pre-emphasis lowers an optical SNR, and this also distorts a signal waveform due to a nonlinear effect of the transmission line attributable to the rise in signal optical power of a distance average. The pre-emphasis has inconvenience that the pre-emphasis effect becomes smaller as the transmission distance becomes longer. On the other hand, the inline automatic gain inclination compensator can minimize excessive deterioration of the optical SNR and the reception characteristics. However, there are other problems like the reliability of this compensator and the increase in the cost of the apparatus.

SUMMARY OF THE INVENTION

It is an object of this invention to provide an optical amplifier apparatus capable of controlling a gain inclination and making constant a light output level in amplifying wavelength-multiplexed lights, without depending on the provision of pre-emphasis and without generating other problems like the reliability of a compensator and the increase in the cost of the apparatus.

DISCLOSURE OF THE INVENTION

The optical amplifier apparatus according to one aspect of the present invention comprises an optical amplifier which amplifies an input signal light, an output detecting unit which detects an output level of the optical amplifier, an output control unit which controls an output level of the optical amplifier according to an output level detected by the output detecting unit, a gain inclination detecting unit which detects a gain inclination relating to a wavelength of the optical amplifier, and a gain inclination control unit which controls a gain inclination of the optical amplifier according to a gain inclination detected by the gain inclination detecting unit.

The optical amplifier apparatus according to another aspect of the present invention comprises an optical amplifier which amplifies an input wavelength-multiplexed signal light, an optical variable attenuator which attenuates an output signal light of the optical amplifier, an output detecting unit which detects an output level at an output side of the optical variable attenuator, an output control unit which controls the attenuation of an output signal light attenuated by the optical variable attenuator according to an output level detected by the output detecting unit, a gain inclination detecting unit which detects a gain inclination relating to a wavelength of the optical amplifier, and a gain inclination control unit which controls a gain inclination by adjusting an output light of an excitation light source of the optical amplifier according to a gain inclination detected by the gain inclination detecting unit.

The optical amplifier apparatus according to still another aspect of the present invention comprises an optical amplifier which amplifies an input wavelength-multiplexed signal light, an optical variable attenuator which attenuates an output signal light of the optical amplifier, an output detecting unit which detects an output level at an output side of the optical variable attenuator, an output control unit which controls an output light of an excitation light source of the optical amplifier according to an output level detected by the output detecting unit, a gain inclination detecting unit which detects a gain inclination relating to a wavelength of the optical amplifier, and a gain inclination control unit which controls a gain inclination by adjusting the attenuation of an output signal light attenuated by the optical variable attenuator according to a gain inclination detected by the gain inclination detecting unit.

The optical amplifier apparatus according to still another aspect of the present invention comprises an optical amplifier which amplifies an input wavelength-multiplexed signal light, a compensation light source which injects a compensation light that propagates in a forward direction of a propagation direction of an input signal light to the optical amplifier, a wavelength selecting unit which interrupts a compensation light at an output side of the optical amplifier, and transmits only a signal light, an output detecting unit which detects an output level of a signal light at an output side of the wavelength selecting unit, an output control unit which controls an output light of the compensation light source according to an output level detected by the output detecting unit, a gain inclination detecting unit which detects a gain inclination of the optical amplifier, and a gain inclination control unit which controls a gain inclination by adjusting an output light of an excitation light source of the optical amplifier according to a gain inclination detected by the gain inclination detecting unit.

The optical amplifier apparatus according to still another aspect of the present invention comprises an optical amplifier which amplifies an input wavelength-multiplexed signal light, a compensation light source which injects a compensation light that propagates in a forward direction of a propagation direction of the input signal light to the optical amplifier, a wavelength selecting unit which interrupts a compensation light at an output side of the optical amplifier, and transmits only a signal light, an output detecting unit which detects an output level of a signal light at an output side of the wavelength selecting unit, an output control unit which controls an output light of an excitation light source of the optical amplifier according to an output level detected by the output detecting unit, a gain inclination detecting unit which detects a gain inclination of the optical amplifier, and a gain inclination control unit which controls a gain inclination by adjusting an output light of the compensation light source according to a gain inclination detected by the gain inclination detecting unit.

The optical amplifier apparatus according to still another aspect of the present invention comprises an optical amplifier which amplifies an input wavelength-multiplexed signal light, a compensation light source which injects a compensation light that propagates in a forward direction of a propagation direction of the input signal light to the optical amplifier, an optical variable attenuator which attenuates an output signal light of the optical amplifier, a wavelength selecting unit which interrupts a compensation light at an output side of the optical variable attenuator, and transmits only a signal light, an output detecting unit which detects an output level of a signal light at an output side of the wavelength selecting unit, an output control unit which controls the attenuation of an output signal light of the optical variable attenuator according to an output level detected by the output detecting unit, a gain inclination detecting unit which detects a gain inclination of the optical amplifier, and a gain inclination control unit which controls a gain inclination by adjusting an output light of the compensation light source according to a gain inclination detected by the gain inclination detecting unit.

The optical amplifier apparatus according to still another aspect of the present invention comprises an optical amplifier which amplifies an input wavelength-multiplexed signal light, a compensation light source which injects a compensation light that propagates in a forward direction of a propagation direction of the input signal light to the optical amplifier, an optical variable attenuator which attenuates an output signal light of the optical amplifier, a wavelength selecting unit which interrupts a compensation light at an output side of the optical variable attenuator, and transmits only a signal light, an output detecting unit which detects an output level of a signal light at an output side of the wavelength selecting unit, an output control unit which controls an output light of the compensation light source according to an output level detected by the output detecting unit, a gain inclination detecting unit which detects a gain inclination of the optical amplifier, and a gain inclination control unit which controls a gain inclination by adjusting the attenuation of an output signal light attenuated by the optical variable attenuator according to a gain inclination detected by the gain inclination detecting unit.

The optical amplifier apparatus according to still another aspect of the present invention comprises a first optical amplifier which amplifies an input wavelength-multiplexed signal light, an optical variable attenuator which attenuates an output signal light of the first optical amplifier, a second optical amplifier which amplifies an output signal light of the optical variable attenuator, an output detecting unit which detects an output level at an output side of the second optical amplifier, an output control unit which controls the attenuation of an output signal light attenuated by the optical variable attenuator according to an output level detected by the output detecting unit, a gain inclination detecting unit which detects a gain inclination of the second optical amplifier, and a gain inclination control unit which controls a gain inclination by adjusting output lights of excitation light sources of the first optical amplifier and the second optical amplifier according to a gain inclination detected by the gain inclination detecting unit.

The optical amplifier apparatus according to still another aspect of the present invention comprises a first optical amplifier which amplifies an input wavelength-multiplexed signal light, an optical variable attenuator which attenuates an output signal light of the first optical amplifier, a second optical amplifier which amplifies an output signal light of the optical variable attenuator, an output detecting unit which detects an output level at an output side of the second optical amplifier, an output control unit which controls output lights of excitation light sources of the first optical amplifier and the second optical amplifier according to an output level detected by the output detecting unit, a gain inclination detecting unit which detects a gain inclination of the second optical amplifier, and a gain inclination control unit which controls a gain inclination by adjusting the attenuation of an output signal light attenuated by the optical variable attenuator according to a gain inclination detected by the gain inclination detecting unit.

The optical amplifier apparatus according to still another aspect of the present invention comprises an optical amplifier which amplifies an input wavelength-multiplexed signal light, a compensation light source which injects a compensation light that propagates in a forward direction of a propagation direction of the input signal light to the optical amplifier, a first optical amplifier which amplifies the signal light, an optical variable attenuator which attenuates an output signal light of the first optical amplifier, a second optical amplifier which amplifies an output signal light of the optical variable attenuator, a wavelength selecting unit which interrupts a compensation light at an output side of the second optical amplifier, and transmits only a signal light, an output detecting unit which detects an output level of a signal light at an output side of the wavelength selecting unit, an output control unit which controls the attenuation of an output signal light attenuated by the optical variable attenuator according to an output level detected by the output detecting unit, a gain inclination detecting unit which detects a gain inclination of the second optical amplifier, and a gain inclination control unit which controls a gain inclination by adjusting an output light of the compensation light source according to a gain inclination detected by the gain inclination detecting unit.

The optical amplifier apparatus according to still another aspect of the present invention comprises an optical amplifier which amplifies an input wavelength-multiplexed signal light, a compensation light source which injects a compensation light that propagates in a forward direction of a propagation direction of the input signal light to the optical amplifier, a first optical amplifier which amplifies the signal light, an optical variable attenuator which attenuates an output signal light of the first optical amplifier, a second optical amplifier which amplifies an output signal light of the optical variable attenuator, a wavelength selecting unit which interrupts a compensation light at an output side of the second optical amplifier, and transmits only a signal light, an output detecting unit which detects an output level of a signal light at an output side of the wavelength selecting unit, an output control unit which controls an output light of the compensation light source according to an output level detected by the output detecting unit, a gain inclination detecting unit which detects a gain inclination of the second optical amplifier, and a gain inclination control unit which controls a gain inclination by adjusting the attenuation of an output signal light attenuated by the optical variable attenuator according to a gain inclination detected by the gain inclination detecting unit.

The optical amplifier apparatus according to still another aspect of the present invention comprises an optical amplifier which amplifies an input wavelength-multiplexed signal light, a compensation light source which injects a compensation light that propagates in a forward direction of a propagation direction of the input signal light to the optical amplifier, a first optical amplifier which amplifies the signal light, a second optical amplifier which amplifies an output signal light of the first optical amplifier, a wavelength selecting unit which interrupts a compensation light at an output side of the second optical amplifier, and transmits only a signal light, an output detecting unit which detects an output level of a signal light at an output side of the wavelength selecting unit, an output control unit which controls output lights of excitation light sources of the first optical amplifier and the second optical amplifier according to an output level detected by the output detecting unit, a gain inclination detecting unit which detects a gain inclination of the optical amplifier, and a gain inclination control unit which controls a gain inclination by adjusting an output light of the compensation light source according to a gain inclination detected by the gain inclination detecting unit.

The optical amplifier apparatus according to still another aspect of the present invention comprises an optical amplifier which amplifies an input wavelength-multiplexed signal light in an excitation light source, a compensation light source which injects a compensation light that propagates in a forward direction of a propagation direction of the input signal light to the optical amplifier, a first optical amplifier which amplifies the signal light, a second optical amplifier which amplifies an output signal light of the first optical amplifier, a wavelength selecting unit which interrupts a compensation light at an output side of the second optical amplifier, and transmits only a signal light, an output detecting unit which detects an output level of a signal light at an output side of the wavelength selecting unit, an output control unit which controls an output light of the compensation light source according to an output level detected by the output detecting unit, a gain inclination detecting unit which detects a gain inclination of the second optical amplifier, and a gain inclination control unit which controls a gain inclination by adjusting output lights of an excitation light source of the first optical amplifier and an excitation light source of the second optical amplifier according to a gain inclination detected by the gain inclination detecting unit.

In the above-mentioned optical amplifier apparatus, the gain inclination detecting unit branches a wavelength-multiplexed signal light, and detects a gain inclination from optical signal levels of a shortest wave and a longest wave.

In the above-mentioned optical amplifier apparatus, the gain inclination detecting unit branches a wavelength-multiplexed signal light, and detects a gain inclination from optical signal levels of three or more waves.

In the above-mentioned optical amplifier apparatus, the optical amplifier apparatus inputs a wavelength-multiplexed signal light having mutually different frequency components superimposed on optical signals of a shortest wave and a longest wave respectively, and the gain inclination detecting unit detects frequency components superimposed on the optical signals of respective wavelengths thereby to detect a gain inclination.

In the above-mentioned optical amplifier apparatus, the optical amplifier apparatus inputs a wavelength-multiplexed signal light having mutually different frequency components superimposed on optical signals of three or more waves respectively, and the gain inclination detecting unit detects frequency components superimposed on the optical signals thereby to detect a gain inclination.

BEST MODE FOR CARRYING OUT THE INVENTION

Embodiments of an optical amplifier apparatus according to the present invention will be explained in detail below with reference to the attached drawings.

Figure 1:
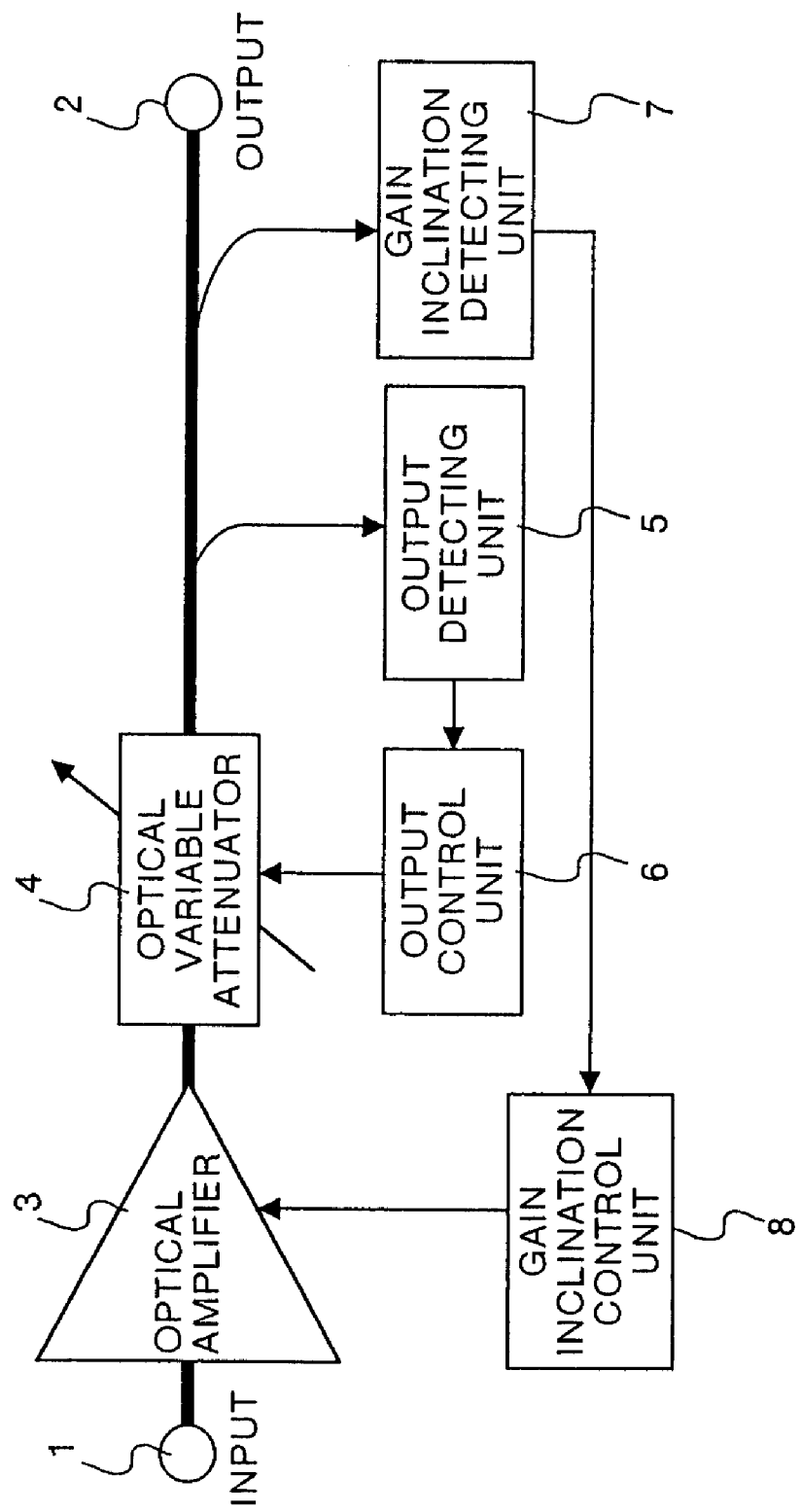
FIG. 1 is a diagram showing a structure of a first embodiment of an optical amplifier apparatus according to the present invention.

First Embodiment:

FIG. 1 shows a first embodiment of an optical amplifier apparatus according to the present invention. In FIG. 1, a reference numeral 1 denotes an input terminal, a reference numeral 2 denotes an output terminal, a reference numeral 3 denotes an optical amplifier, a reference numeral 4 denotes an optical variable attenuator, a reference numeral 5 denotes an output detecting unit, a reference numeral 6 denotes an output control unit, a reference numeral 7 denotes a gain inclination detecting unit, and a reference numeral 8 denotes a gain inclination control unit.

The optical amplifier apparatus of the first embodiment has the optical amplifier 3, the optical variable attenuator 4, the output detecting unit 5, the output control unit 6, the gain inclination detecting unit 7, and the gain inclination control unit 8. The optical amplifier 3 amplifies a wavelength-multiplexed signal light that is input to the input terminal 1 connected with a not shown optical fiber.

The optical variable attenuator 4 variably attenuates an output signal light of the optical amplifier 3. Such an optical variable attenuator can be realized by, for example, a Faraday rotor that utilizes a magnetooptic effect. It is also possible to structure this optical variable attenuator 4 with a device utilizing an electrooptic effect of $LiNbO_3$ or an acoustooptica effect.

The output detecting unit 5 detects an output level of the optical variable attenuator 4, and outputs the detected value of the output level to the output control unit 6. The output control unit 6 controls the attenuation of an output signal light attenuated by the optical variable attenuator 4 according to the detection value, so that an output level detected by the output detecting unit 5 becomes constant.

The gain inclination detecting unit 7 detects a gain inclination from an output of the optical variable attenuator 4, and outputs this detection value to the gain inclination control unit 8. The gain inclination control unit 8 adjusts an excitation light of the optical amplifier 3 according to a gain inclination (a detection value) that is detected by the gain inclination detecting unit 7.

Figure 2:
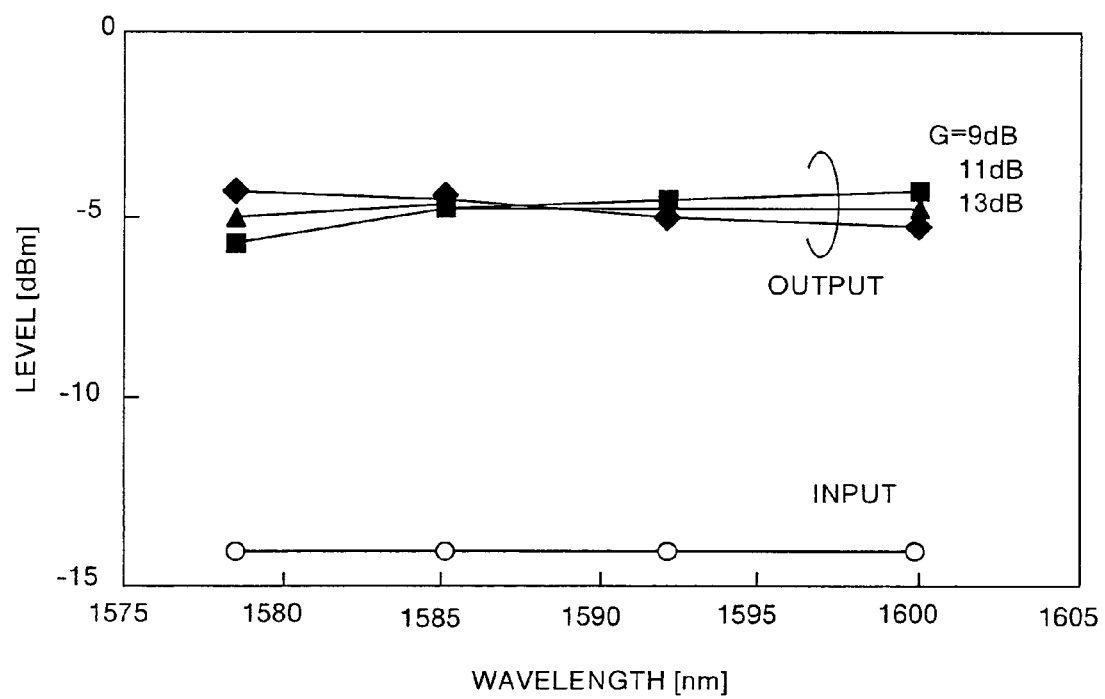
FIG. 2 is a graph showing an example of a gain inclination control of the optical amplifier apparatus according to the first embodiment.

FIG. 2 shows an example of a gain inclination control. In this gain inclination control, the control is carried out by setting an input level of the optical amplifier 3 to −8 dBm, an output level of the optical variable attenuator 4 to +1 dBm, and a gain G of the optical amplifier 3 to 9, 11, and 13 dB respectively. It can be understood from this that the gain inclination is controlled by controlling only the gain G of the optical amplifier 3. Based on the above control, it is possible to realize an optical amplifier apparatus capable of controlling the gain inclination as well as making constant the optical output level, in the amplification of a wavelength-multiplexed signal light.

Figure 3:
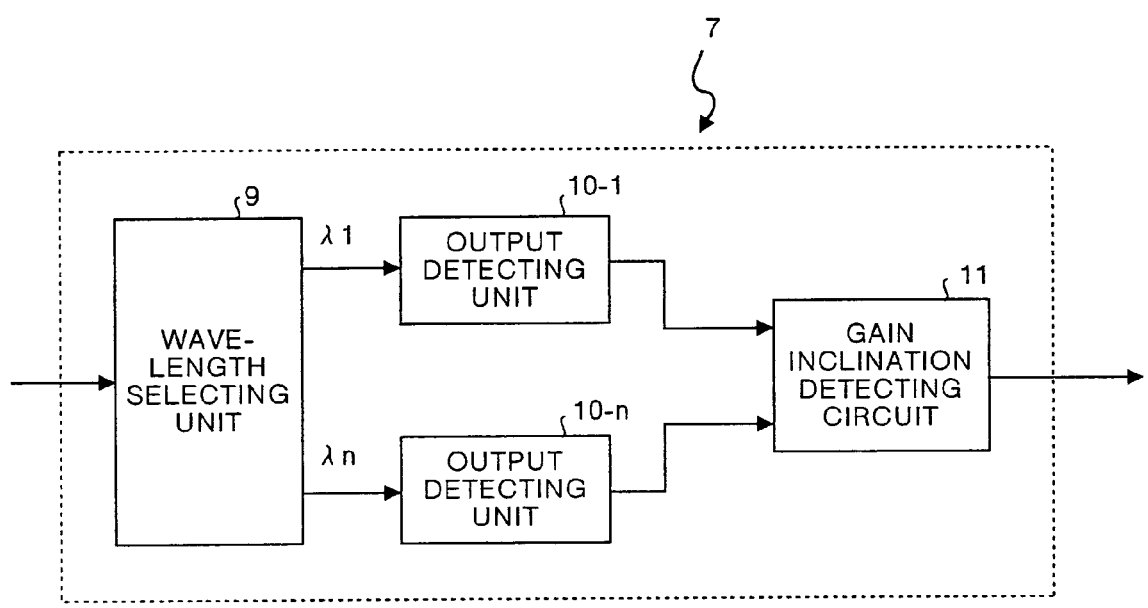
FIG. 3 is a diagram showing a structure of one example of a gain inclination detecting unit in an optical amplifier apparatus according to the present invention.

A detailed example of the gain inclination detecting unit 7 will be explained next with reference to FIG. 3. This gain inclination detecting unit 7 is for branching a wavelength-multiplexed signal light, and detecting a gain inclination from optical signal levels of a shortest wavelength λ1 and a longest wavelength λn. The wavelength selecting unit 9 divides only the components of the shortest wavelength λ1 and the longest wavelength λn out of a wavelength-multiplexed signal light that is output from the optical amplifier 3, more strictly, a wavelength-multiplexed signal light output of the optical variable attenuator 4. The wavelength selecting unit 9 then sends the respective components to optical detecting units 10-1 and 10-n. It is possible to structure the wavelength selecting unit 9 with ease by using an optical filter. It is possible to use a photodiode, an avalanche photodiode, and a photocounter for the optical detecting units 10-1 and 10-n respectively.

The shortest wavelength $\lambda 1$ is sent to the optical detecting unit 10-1, and the longest wavelength $\lambda n$ is sent to the optical detecting unit 10-n. The optical detecting units 10-1 and 10-n convert the received lights into electric signals respectively, and detect a level of the shortest wavelength $\lambda 1$ and a level of the longest wavelength $\lambda n$ of the signal light respectively. The detection values are sent to a gain inclination detecting circuit 11. The gain inclination detecting circuit 11 can detect a gain inclination by comparing the level of the shortest wavelength $\lambda 1$ with the level of the longest wavelength $\lambda n$.

In this first embodiment, it is explained that the gain inclination is detected from the components of the shortest wavelength $\lambda 1$ and the level of the longest wavelength $\lambda n$. However, it is also possible to detect a gain inclination from optical signal levels of three or more waves. In this case, wavelength selecting units may be inserted by a number of multiplexed wavelengths of a wavelength-multiplexed optical signal. These wavelength selecting units divide the signal light having the wavelengths $\lambda 1, \lambda 2, \ldots$, and $\lambda n$ multiplexed together, and send wavelength signals of these wavelengths $\lambda 1, \lambda 2, \ldots$, and $\lambda n$ to respective optical detecting units. Thereafter, the operation similar to that of the above embodiment is carried out.

Figure 4:
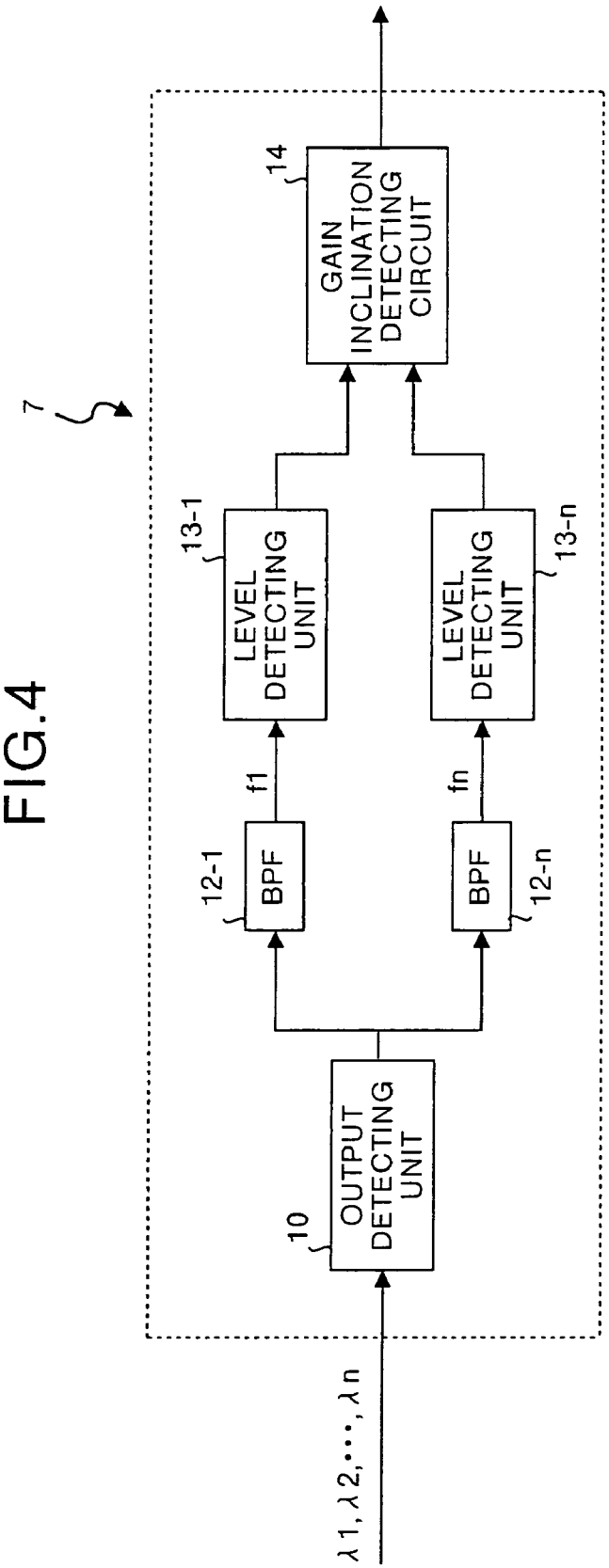
FIG. 4 is a diagram showing a structure of another example of a gain inclination detecting unit in an optical amplifier apparatus according to the present invention.

It is also possible to arrange such that a transmitter side superimposes mutually different frequency components on the optical signals of the shortest wavelength $\lambda 1$ and the longest wavelength $\lambda 2$ respectively. Then, the frequency components superimposed on the optical signals of respective wavelengths may be detected to detect a gain inclination. When a low-frequency tone signal superimposing system is employed, it is possible to accurately control a gain without an influence of cumulative natural discharge optical noise. An example of a structure this gain inclination detecting unit 7 will be explained with reference to FIG. 4. The gain inclination detecting unit 7 is constructed of an optical detecting unit 10, band-pass filters (BPF's) 12-1 and 12-n, level detecting units 13-1 and 13-n, and a gain inclination detecting circuit 14.

A wavelength-multiplexed signal light output of an optical repeater is input to the optical detecting unit 10. The band-pass filters 12-1 and 12-n extract respectively the frequency components allocated to wavelengths, from a detection signal. The level detecting units 13-1 and 13-n detect respectively the levels of signal lights of these frequency components.

In this case, the band-pass filter 12-1 extracts a frequency component f1 that has been superimposed on the shortest wavelength $\lambda 1$, and the band-pass filter 12-n extracts a frequency component fn that has been superimposed on the longest wavelength $\lambda n$. The level detecting units 13-1 and 13-n detect respectively the levels of the extracted frequency components f1 and fn, and send the respective detection values to the gain inclination detecting circuit 14. The gain inclination detecting circuit 14 detects a gain inclination by comparing the levels of these frequency components.

In this first embodiment, it is explained that the gain inclination is detected by superimposing mutually different frequency components on only the shortest wavelength and the longest wavelength. However, it is also possible to superimpose mutually different frequency components on optical signals of three or more waves. The gain inclination detecting circuit detects the superimposed frequency components thereby to detect a gain inclination. In this case, it is necessary to mutually differentiate the wavelengths of the lights that are output from respective optical transmitters, and mutually differentiate the frequencies of sinusoidal wave signals that are superimposed. Further, band-pass filters and level detectors corresponding to the number of superimposed frequencies need to be prepared respectively for the gain inclination detecting unit 7. The center frequency of each band-pass filter is corresponded to the frequency of each sinusoidal wave signal that is superimposed.

Figure 5:
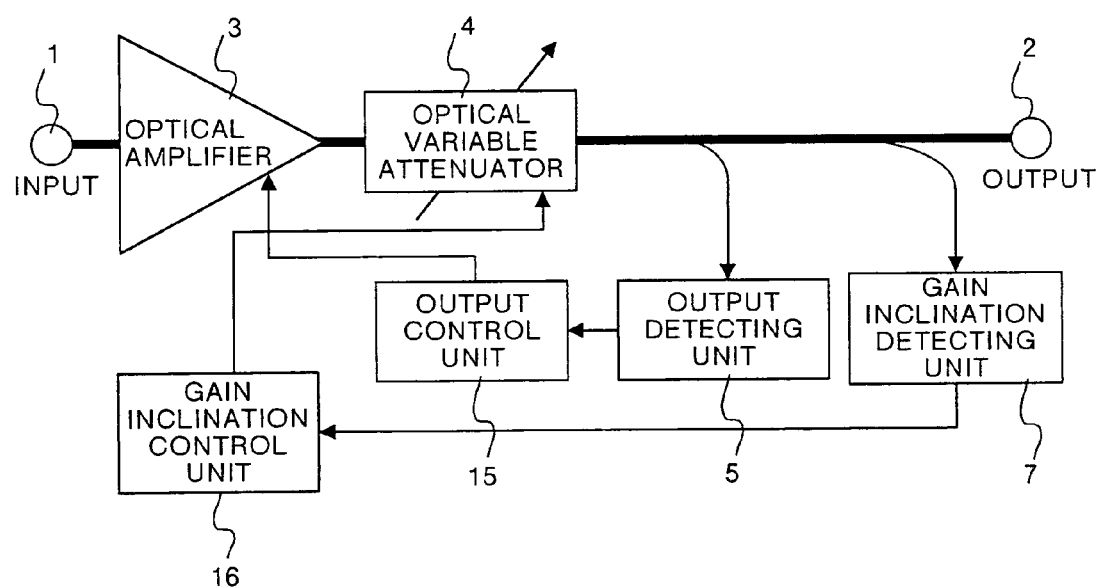
FIG. 5 is a diagram showing a structure of a second embodiment of an optical amplifier apparatus according to the present invention.

Second Embodiment:

FIG. 5 shows a second embodiment of an optical amplifier apparatus according to the present invention. In FIG. 5, portions corresponding to those in FIG. 1 are attached with like reference numerals of the portions in FIG. 1, and their explanation will be omitted.

The optical amplifier apparatus of the second embodiment has the optical amplifier 3, the optical variable attenuator 4, the output detecting unit 5, an output control unit 15, the gain inclination detecting unit 7, and a gain inclination control unit 16.

The output control unit 15 controls an output light of an excitation light source of the optical amplifier 3 so that an output level becomes constant, according to an output level detected by the output detecting unit 5. The gain inclination control unit 16 controls a gain inclination to an optimum value by adjusting the attenuation of an output signal light attenuated by the optical variable attenuator 4 according to a gain inclination detected by the gain inclination detecting unit 7.

Based on the above control, in this second embodiment also, like in the first embodiment, it is possible to realize an optical amplifier apparatus capable of controlling the gain inclination as well as making constant the optical output level, in the amplification of a wavelength-multiplexed signal light.

Figure 6:
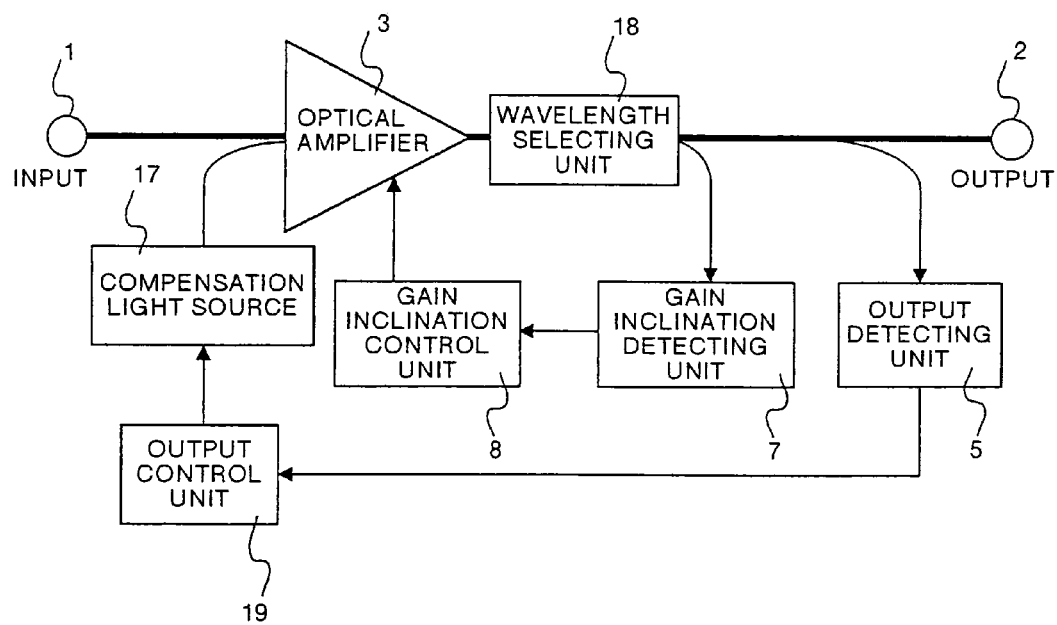
FIG. 6 is a diagram showing a structure of a third embodiment of an optical amplifier apparatus according to the present invention.

Third Embodiment:

FIG. 6 shows a third embodiment of an optical amplifier apparatus according to the present invention. In FIG. 6, portions corresponding to those in FIG. 1 are attached with like reference numerals of the portions in FIG. 1, and their explanation will be omitted.

The optical amplifier apparatus of the third embodiment has the optical amplifier 3, a compensation light source 17, a wavelength selecting unit 18, the output detecting unit 5, an output control unit 19, the gain inclination detecting unit 7, and the gain inclination control unit 8.

The compensation light source 17 injects to an input side of the optical amplifier 3 a compensation light that propagates in a forward direction of a propagation direction of an input signal light to the optical amplifier 3. In this case, the gain of the optical amplifier 3 changes depending on total power of a signal light and a compensation light. Therefore, the power of the signal light changes depending on the power of the compensation light, and then the level of a wavelength-multiplexed signal light at an output terminal 2 changes. The wavelength selecting unit 18 is constructed of an optical rejection filter or a coupler, for example. This wavelength selecting unit 18 interrupts only a light of the wavelength of the compensation light source 17 (the compensation light) out of the output light of the optical amplifier 3, and transmits other components of the wavelength-multiplexed signal light.

The output detecting unit 5 detects an output level of a wavelength-multiplexed signal light at an output side of the wavelength selecting unit 18, and outputs a detection value to the output control unit 19. The output control unit 19 controls an output level of the compensation light source 17 according to the detection value so that the output level detected by the output detecting unit 5 becomes constant. The gain inclination detecting unit 7 detects a gain inclination from an output of the optical variable attenuator 4, and outputs a detection value to the gain inclination control unit 8. The gain inclination control unit 8 controls the gain inclination to an optimum value by adjusting an excitation light of the optical amplifier 3 according to a gain inclination (a detection value) detected by the gain inclination detecting unit 7.

Therefore, in this third embodiment also, like in the first embodiment, it is possible to realize an optical amplifier apparatus capable of controlling the gain inclination as well as making constant the optical output level, in the amplification of a wavelength-multiplexed signal light.

Figure 7:
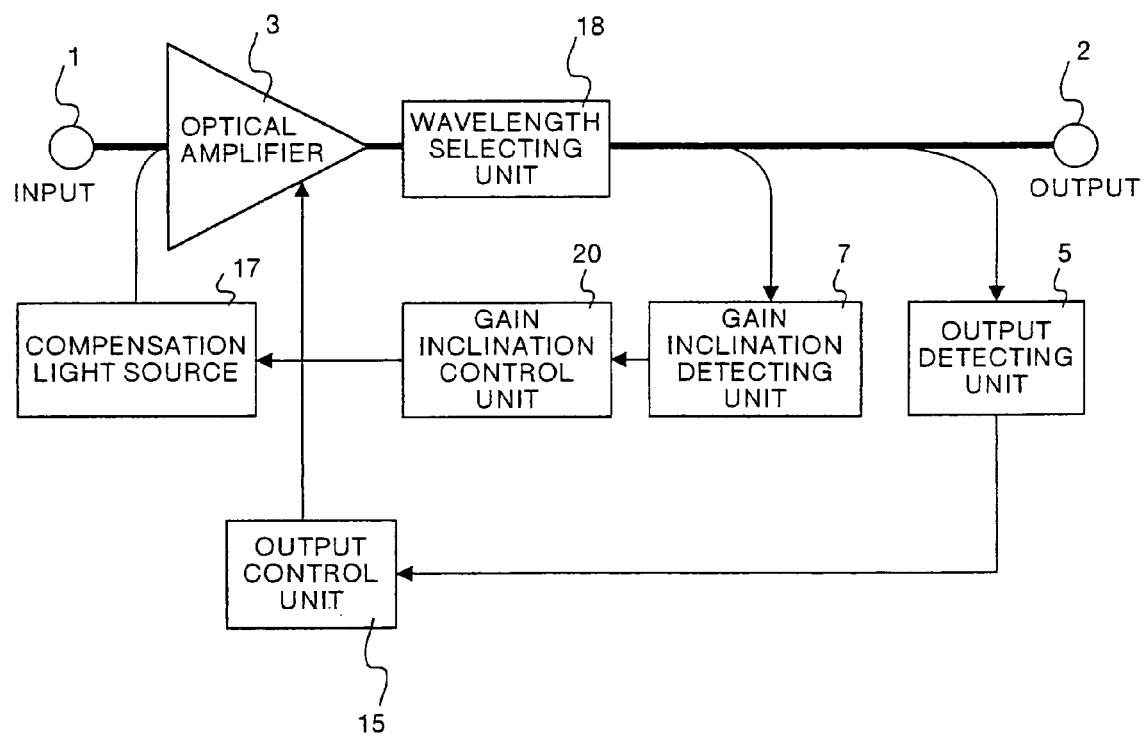
FIG. 7 is a diagram showing a structure of a fourth embodiment of an optical amplifier apparatus according to the present invention.

Fourth Embodiment:

FIG. 7 shows a fourth embodiment of an optical amplifier apparatus according to the present invention. In FIG. 7, portions corresponding to those in FIG. 5 and FIG. 6 are attached with like reference numerals of the portions in FIG. 5 and FIG. 6, and their explanation will be omitted.

The optical amplifier apparatus of the fourth embodiment has the optical amplifier 3, the compensation light source 17, the wavelength selecting unit 18, the output detecting unit 5, the output control unit 15, the gain inclination detecting unit 7, and a gain inclination control unit 20.

The output detecting unit 5 detects an output level of a wavelength-multiplexed signal light at an output side of the wavelength selecting unit 18, and outputs a detection value to the output control unit 15. The output control unit 15 controls an output light of an excitation light source of the optical amplifier 3 according to the detection value so that the output level detected by the output detecting unit 5 becomes constant. The gain inclination detecting unit 7 detects a gain inclination from an output of the optical variable attenuator 4, and outputs a detection value to the gain inclination control unit 20. The gain inclination control unit 20 controls the gain inclination to an optimum value by adjusting an output level of the compensation light source 17 according to a gain inclination (i.e. a value of the gain inclination) detected by the gain inclination detecting unit 7.

Therefore, in this fourth embodiment also, like in the first embodiment, it is possible to realize an optical amplifier apparatus capable of controlling the gain inclination as well as making constant the optical output level, in the amplification of a wavelength-multiplexed signal light.

Figure 8:
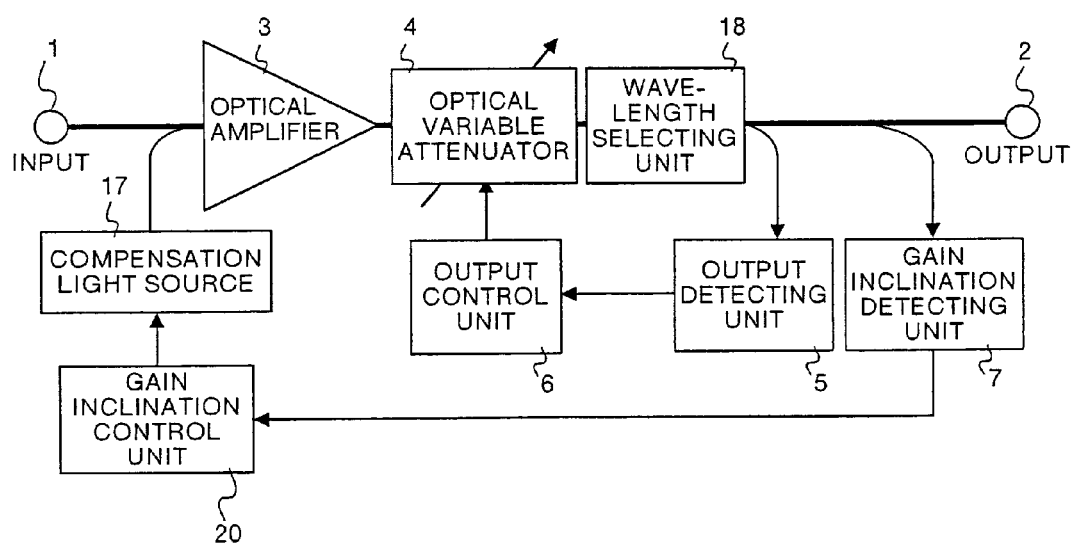
FIG. 8 is a diagram showing a structure of a fifth embodiment of an optical amplifier apparatus according to the present invention.

Fifth Embodiment:

FIG. 8 shows a fifth embodiment of an optical amplifier apparatus according to the present invention. In FIG. 8, portions corresponding to those in FIG. 1 and FIG. 7 are attached with like reference numerals of the portions in FIG. 1 and FIG. 7, and their explanation will be omitted.

The optical amplifier apparatus of the fifth embodiment has the optical amplifier 3, the optical variable attenuator 4, the compensation light source 17, the wavelength selecting unit 18, the output detecting unit 5, the output control unit 6, the gain inclination detecting unit 7, and the gain inclination control unit 20.

The output detecting unit 5 detects an output level of a wavelength-multiplexed signal light at an output side of the wavelength selecting unit 18, and outputs a detection value to the output control unit 6. The output control unit 6 controls the attenuation of an output signal light of the optical variable attenuator 4 according to the detection value so that the output level detected by the output detecting unit 5 becomes constant. The gain inclination detecting unit 7 detects a gain inclination from an output of the optical variable attenuator 4, and outputs a detection value to the gain inclination control unit 20. The gain inclination control unit 20 controls the gain inclination to an optimum value by adjusting an output level of the compensation light source 17 according to a gain inclination (i.e. a value of the gain inclination) detected by the gain inclination detecting unit 7, in a similar manner to that of the fourth embodiment.

Therefore, in this fifth embodiment also, like in the first embodiment, it is possible to realize an optical amplifier apparatus capable of controlling the gain inclination as well as making constant the optical output level, in the amplification of a wavelength-multiplexed signal light.

Figure 9:
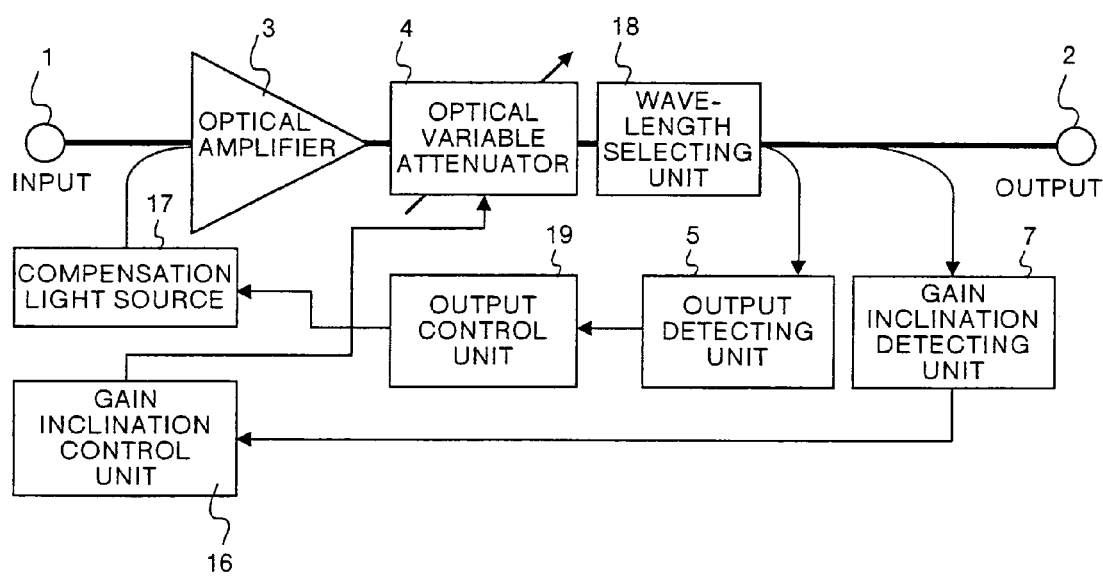
FIG. 9 is a diagram showing a structure of a sixth embodiment of an optical amplifier apparatus according to the present invention.

Sixth Embodiment:

FIG. 9 shows a sixth embodiment of an optical amplifier apparatus according to the present invention. In FIG. 9, portions corresponding to those in FIG. 5 and FIG. 6 are attached with like reference numerals of the portions in FIG. 5 and FIG. 6, and their explanation will be omitted.

The optical amplifier apparatus of the sixth embodiment has the optical amplifier 3, the optical variable attenuator 4, the compensation light source 17, the wavelength selecting unit 18, the output detecting unit 5, the output control unit 19, the gain inclination detecting unit 7, and the gain inclination control unit 16.

The output detecting unit 5 detects an output level of a wavelength-multiplexed signal light at an output side of the wavelength selecting unit 18, and outputs a detection value to the output control unit 19. The output control unit 19 controls an output level of the compensation light source 17 according to the detection value so that the output level detected by the output detecting unit 5 becomes constant, in a similar manner to that of the third embodiment. The gain inclination detecting unit 7 detects a gain inclination from an output of the optical variable attenuator 4, and outputs a detection value to the gain inclination control unit 16. The gain inclination control unit 16 controls the gain inclination to an optimum value by adjusting the attenuation of an output signal light attenuated by the optical variable attenuator 4 according to a gain inclination detected by the gain inclination detecting unit 7, in a similar manner to that of the second embodiment.

Therefore, in this sixth embodiment also, like in the first embodiment, it is possible to realize an optical amplifier apparatus capable of controlling the gain inclination as well as making constant the optical output level, in the amplification of a wavelength-multiplexed signal light.

Figure 10:
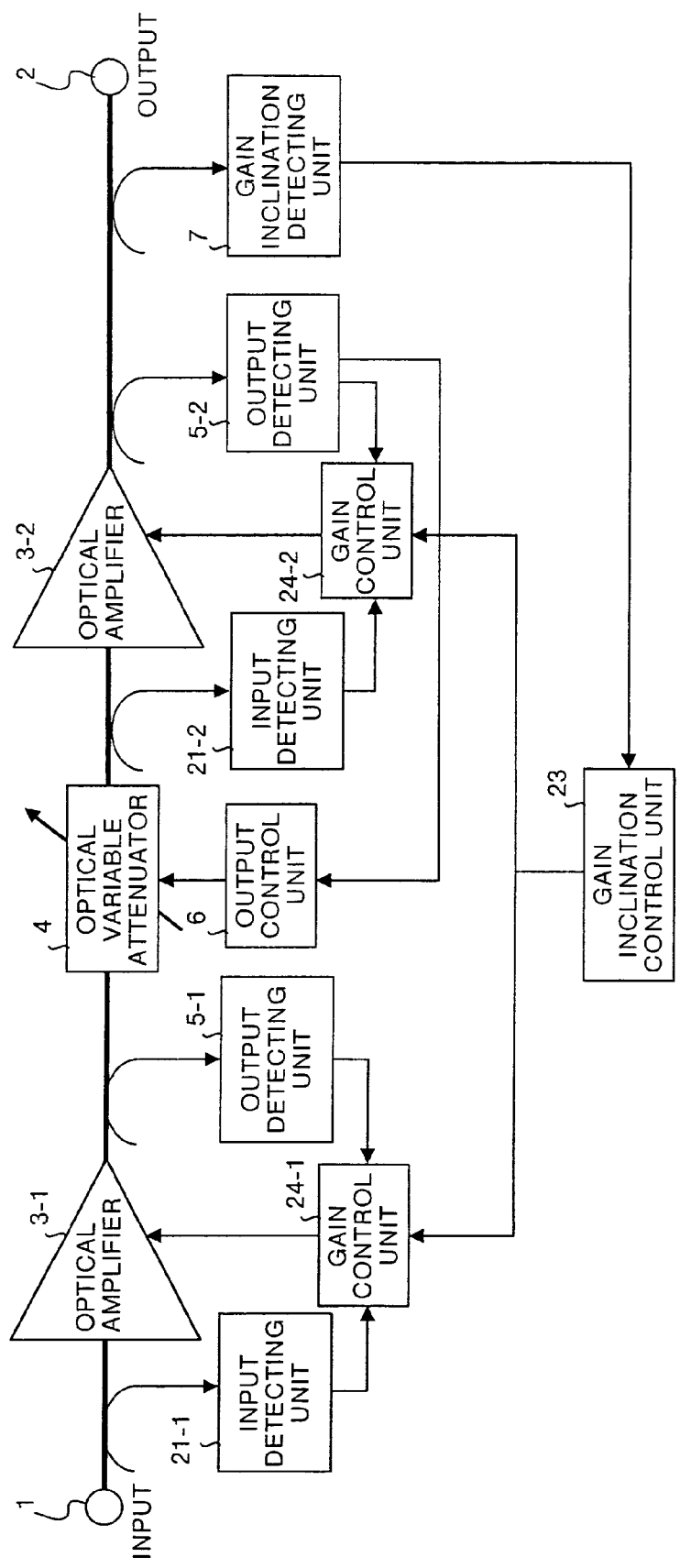
FIG. 10 is a diagram showing a structure of a seventh embodiment of an optical amplifier apparatus according to the present invention.

Seventh Embodiment:

FIG. 10 shows a seventh embodiment of an optical amplifier apparatus according to the present invention. In FIG. 10, portions corresponding to those in FIG. 1 are attached with like reference numerals of the portions in FIG. 1, and their explanation will be omitted.

The optical amplifier apparatus of the seventh embodiment has the first and second optical amplifiers 3-1 and 3-2, the optical variable attenuator 4, output detecting units 5-1 and 5-2, the output control unit 6, the gain inclination detecting unit 7, a gain inclination control unit 23, input detecting units 21-1 and 21-2, and gain control units 24-1 and 24-2.

The gain of the first optical amplifier 3-1 and the gain of the second optical amplifier 3-2 are always the same. The output detecting unit 5-2 monitors an output level of the second optical amplifier 3-2, and the output control unit 6 control the optical variable attenuator 4 so that this output level becomes constant. Attenuation A of the optical variable attenuator 4 is uniquely determined as A=P2−P1−2×G, where G represents a gain of the first optical amplifier 3-1 as well as a gain of the second optical amplifier 3-2, P-1 represents an input level of the first optical amplifier 3-1, and P2 represents an output level of the second optical amplifier 3-2. On the other hand, a gain inclination D is expressed as a function of the gain G, like D=D (G).

In other words, it is possible to uniquely determine the gain inclination D based on the gain G of the first optical amplifier 3-1 and the second optical amplifier 3-2. It is possible to control the gain inclination by giving only the gain G of the optical amplifier from the outside, without changing the input and output levels.

Figure 11:
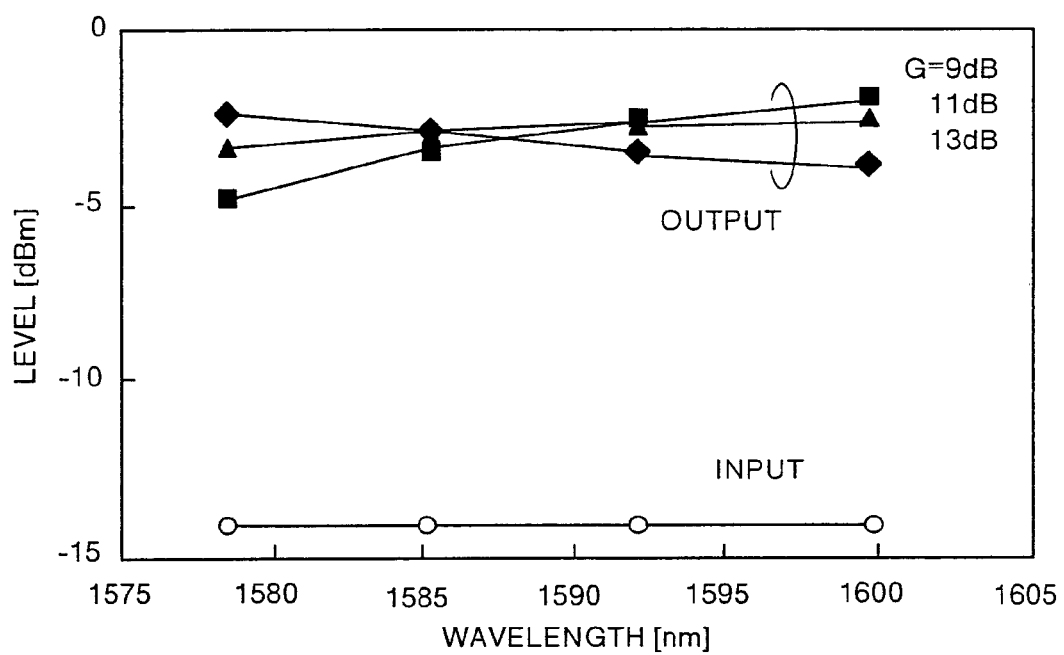
FIG. 11 is a graph showing an example of a gain inclination control of the optical amplifier apparatus according to the seventh embodiment.

FIG. 11 shows an example of a gain inclination control. In this example of the gain inclination control, the control is carried out by setting an input level P1 of the first optical amplifier 3-1 to −8 dBm, an output level P2 of the second optical amplifier 3-2 to +3 dBm, and the gain G of the optical amplifiers to 9, 11, and 13 dB respectively. It can be understood that the gain inclination is controlled by controlling only the gain G of the optical amplifiers.

Therefore, in this seventh embodiment also, like in the first embodiment, it is possible to realize an optical amplifier apparatus capable of controlling the gain inclination as well as making constant the optical output level, in the amplification of a wavelength-multiplexed signal light.

Figure 12:
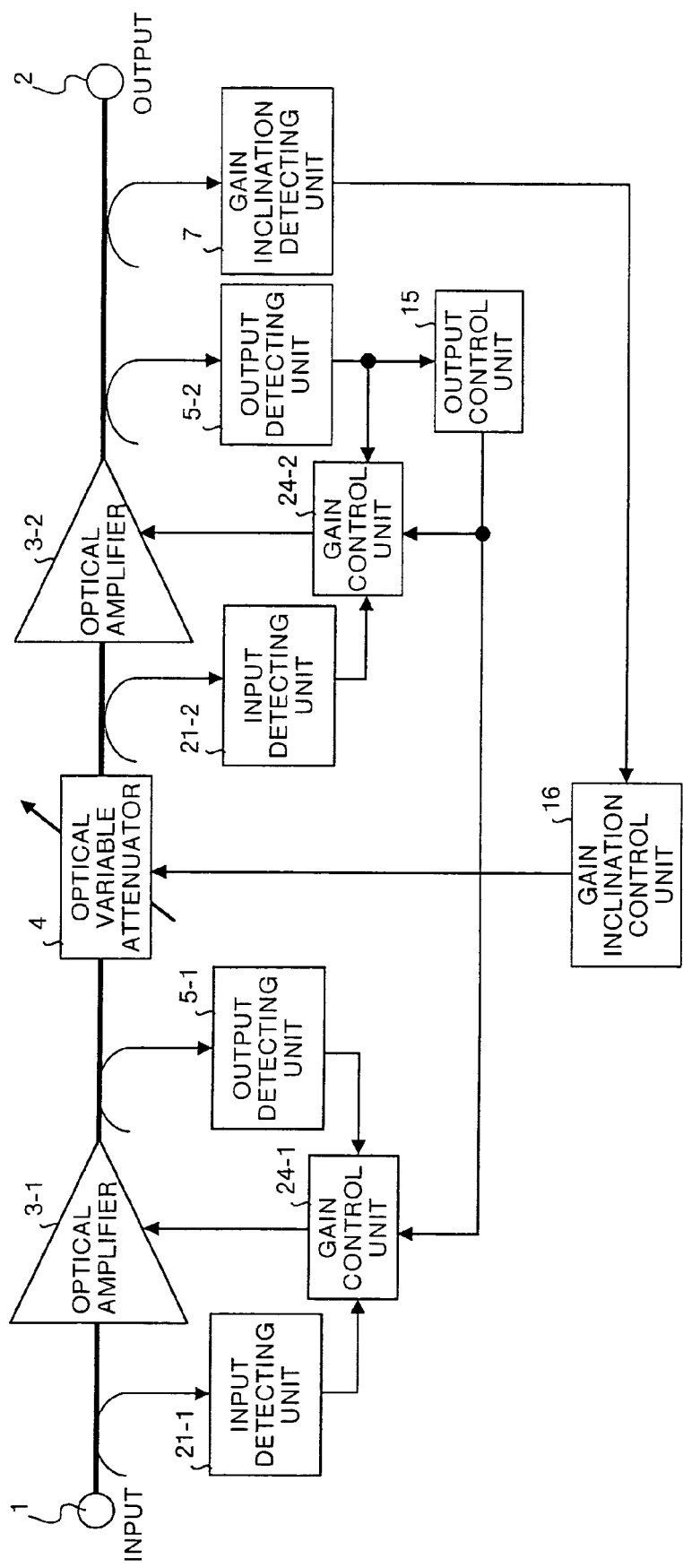
FIG. 12 is a diagram showing a structure of an eighth embodiment of an optical amplifier apparatus according to the present invention.

Eighth Embodiment:

FIG. 12 shows an eighth embodiment of an optical amplifier apparatus according to the present invention. In FIG. 12, portions corresponding to those in FIG. 5 and FIG. 10 are attached with like reference numerals of the portions in FIG. 5 and FIG. 10, and their explanation will be omitted.

The optical amplifier apparatus of the eighth embodiment has the first and second optical amplifiers 3-1 and 3-2, the optical variable attenuator 4, output detecting units 5-1 and 5-2, the output control unit 15, the gain inclination detecting unit 7, the gain inclination control unit 16, the input detecting units 21-1 and 21-2, and the gain control units 24-1 and 24-2.

The output control unit 15 controls output lights of excitation light sources of the first optical amplifier 3-1 and the second optical amplifier 3-2 so that an output level becomes constant according to an output level detected by the output detecting unit 5-2. In this case, the gain control unit 24-1 and the gain control unit 24-2 control the output lights of the excitation light sources so that the gain of the first optical amplifier 3-1 becomes equal to the gain of the second optical amplifier 3-2. The gain inclination control unit 16 controls the gain inclination to an optimum value by adjusting the attenuation of an output signal light attenuated by the optical variable attenuator 4 according to a gain inclination detected by the gain inclination detecting unit 7.

Therefore, in this eighth embodiment also, like in the first embodiment, it is possible to realize an optical amplifier apparatus capable of controlling the gain inclination as well as making constant the optical output level, in the amplification of a wavelength-multiplexed signal light.

Figure 13:
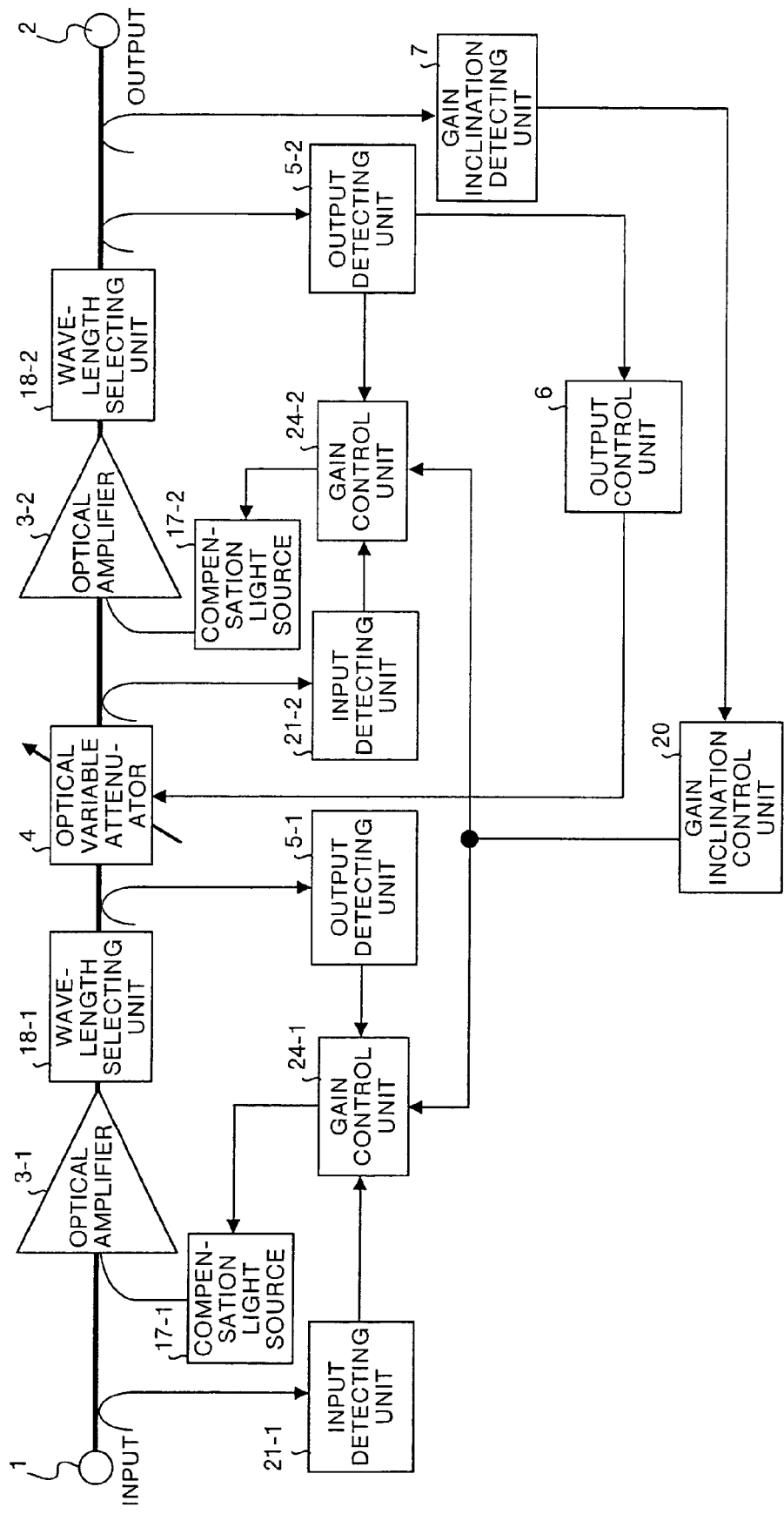
FIG. 13 is a diagram showing a structure of a ninth embodiment of an optical amplifier apparatus according to the present invention.

Ninth Embodiment:

FIG. 13 shows a ninth embodiment of an optical amplifier apparatus according to the present invention.

The optical amplifier apparatus of the ninth embodiment has the first and second optical amplifiers 3-1 and 3-2, the optical variable attenuator 4, a first compensation light source 17-1, a second compensation light source 17-2, a first wavelength selecting unit 18-1, a second wavelength selecting unit 18-2, output detecting units 5-1 and 5-2, the output control unit 6, the gain inclination detecting unit 7, the gain inclination control unit 20, the input detecting units 21-1 and 21-2, and the gain control units 24-1 and 24-2. The reference number 1 denotes the input terminal, and 2 denotes the output terminal.

The output detecting unit 5-2 detects an output level of a wavelength-multiplexed signal light at an output side of the second wavelength selecting unit 18-2, and outputs a detection value to the output control unit 6. The output control unit 6 controls the attenuation of an output signal light attenuated by the optical variable attenuator 4 according to the detection value so that the output level detected by the output detecting unit 5-2 becomes constant. The gain inclination detecting unit 7 detects a gain inclination from an output of the second wavelength selecting unit 18-2, and outputs a detection value to the gain inclination control unit 20. The gain inclination control unit 20 controls the gain inclination to an optimum value by adjusting output levels of the first compensation light source 17-1 and the second compensation light source 17-2 according to a gain inclination (a detection value) detected by the gain inclination detecting unit 7.

Therefore, in this ninth embodiment also, like in the first embodiment, it is possible to realize an optical amplifier apparatus capable of controlling the gain inclination as well as making constant the optical output level, in the amplification of a wavelength-multiplexed signal light.

Figure 14:
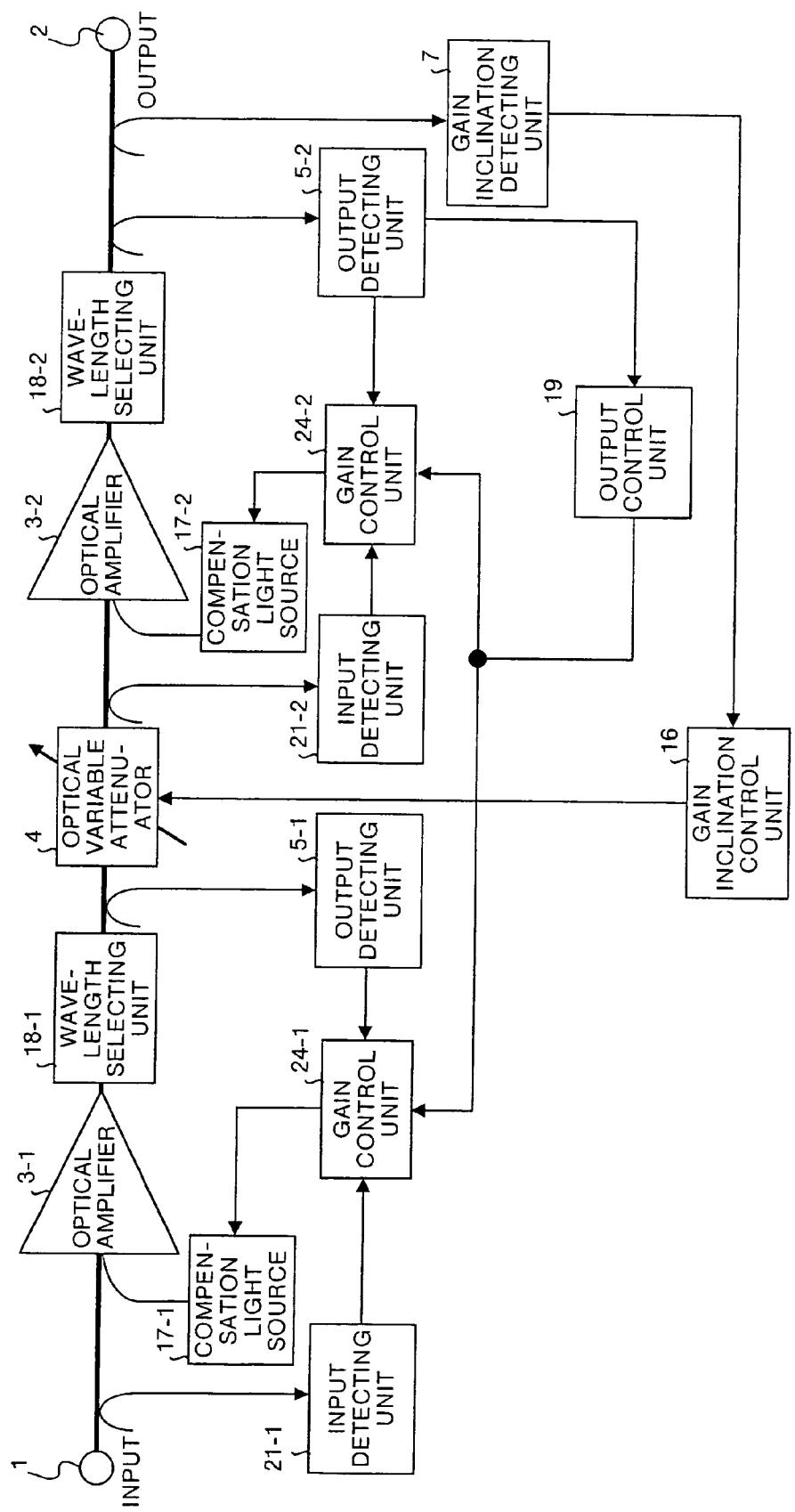
FIG. 14 is a diagram showing a structure of a tenth embodiment of an optical amplifier apparatus according to the present invention.

Tenth Embodiment:

FIG. 14 shows a tenth embodiment of an optical amplifier apparatus according to the present invention.

The optical amplifier apparatus of the tenth embodiment has the first and second optical amplifiers 3-1 and 3-2, the optical variable attenuator 4, the first and second compensation light sources 17-1 and 17-2, the first and second wavelength selecting units 18-1 and 18-2, the output detecting units 5-1 and 5-2, the output control unit 19, the gain inclination detecting unit 7, the gain inclination control unit 16, the input detecting units 21-1 and 21-2, and the gain control units 24-1 and 24-2. The reference number 1 denotes the input terminal, and 2 denotes the output terminal.

The output detecting unit 5-2 detects an output level of a wavelength-multiplexed signal light at an output side of the second wavelength selecting unit 18-2, and outputs a detection value to the output control unit 19. The output control unit 19 controls output levels of the first compensation light source 17-1 and the second compensation light source 17-2 according to the detection value so that the output level detected by the output detecting unit 5-2 becomes constant. The gain inclination detecting unit 7 detects a gain inclination from an output of the second wavelength selecting unit 18-2, and outputs a detection value to the gain inclination control unit 16. The gain inclination control unit 16 controls the gain inclination to an optimum value by adjusting the attenuation of an output signal light attenuated by the optical variable attenuator 4 according to a gain inclination (a detection value) detected by the gain inclination detecting unit 7.

Therefore, in this tenth embodiment also, like in the first embodiment, it is possible to realize an optical amplifier apparatus capable of controlling the gain inclination as well as making constant the optical output level, in the amplification of a wavelength-multiplexed signal light.

Figure 15:
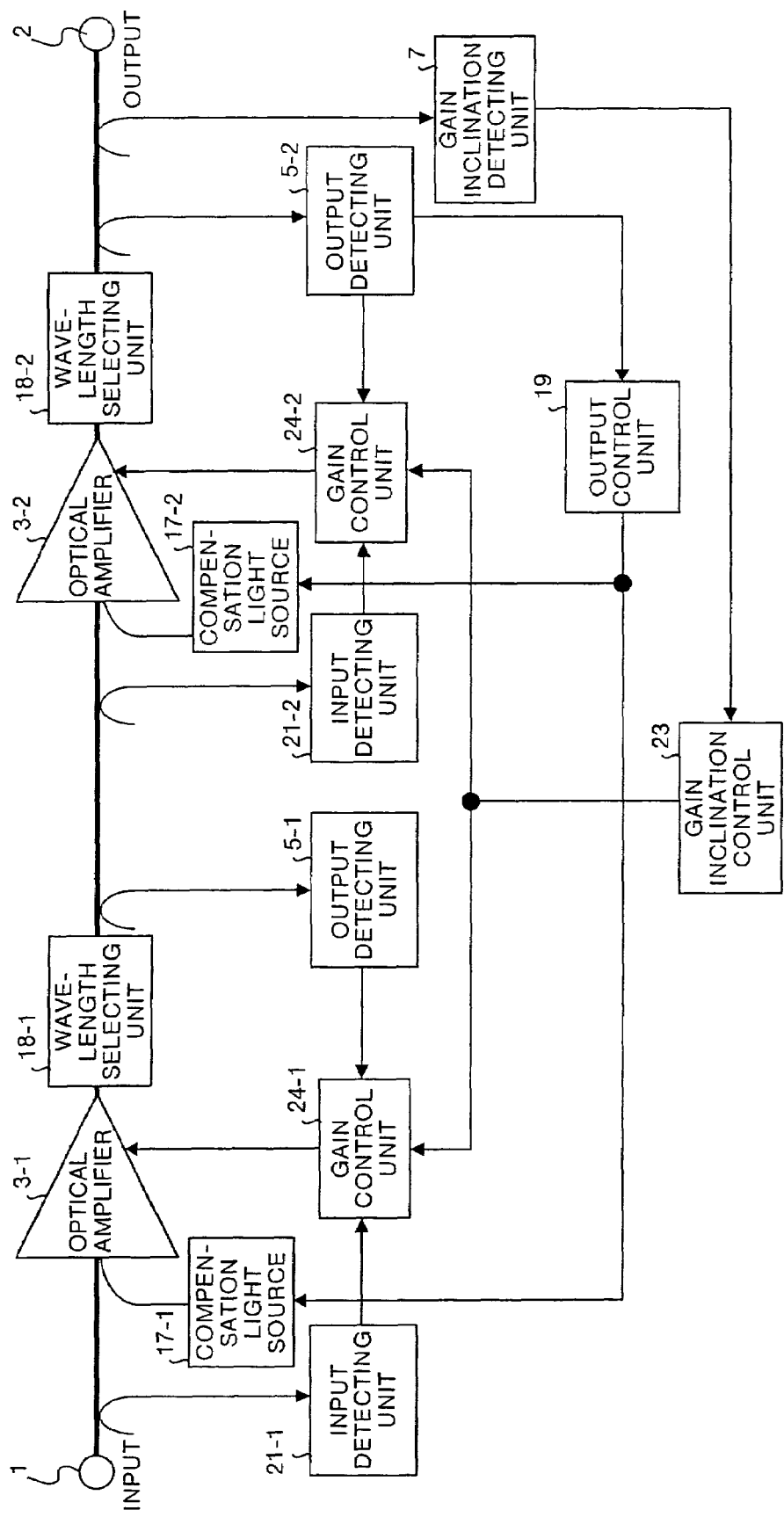
FIG. 15 is a diagram showing a structure of an eleventh embodiment of an optical amplifier apparatus according to the present invention.

Eleventh Embodiment:

FIG. 15 shows an eleventh embodiment of an optical amplifier apparatus according to the present invention.

The optical amplifier apparatus of the eleventh embodiment has the first and second optical amplifiers 3-1 and 3-2, the first and second compensation light sources 17-1 and 17-2, the first and second wavelength selecting units 18-1 and 18-2, the output detecting units 5-1 and 5-2, the output control unit 19, the gain inclination detecting unit 7, the gain inclination control unit 23, the input detecting units 21-1 and 21-2, and the gain control units 24-1 and 24-2. The reference number 1 denotes the input terminal, and 2 denotes the output terminal.

The output detecting unit 5-2 detects an output level of a wavelength-multiplexed signal light at an output side of the second wavelength selecting unit 18-2, and outputs a detection value to the output control unit 19. The output control unit 19 controls output levels of the first compensation light source 17-1 and the second compensation light source 17-2 according to the detection value so that the output level detected by the output detecting unit 5-2 becomes constant. The gain inclination detecting unit 7 detects a gain inclination from an output of the second wavelength selecting unit 18-2, and outputs a detection value to the gain inclination control unit 23. The gain inclination control unit 23 controls the gain inclination to an optimum value by adjusting output lights of excitation light sources of the first optical amplifier 3-1 and the second optical amplifier 3-2 according to a gain inclination (a detection value) detected by the gain inclination detecting unit 7.

Therefore, in this eleventh embodiment also, like in the first embodiment, it is possible to realize an optical amplifier apparatus capable of controlling the gain inclination as well as making constant the optical output level, in the amplification of a wavelength-multiplexed signal light.

Figure 16:
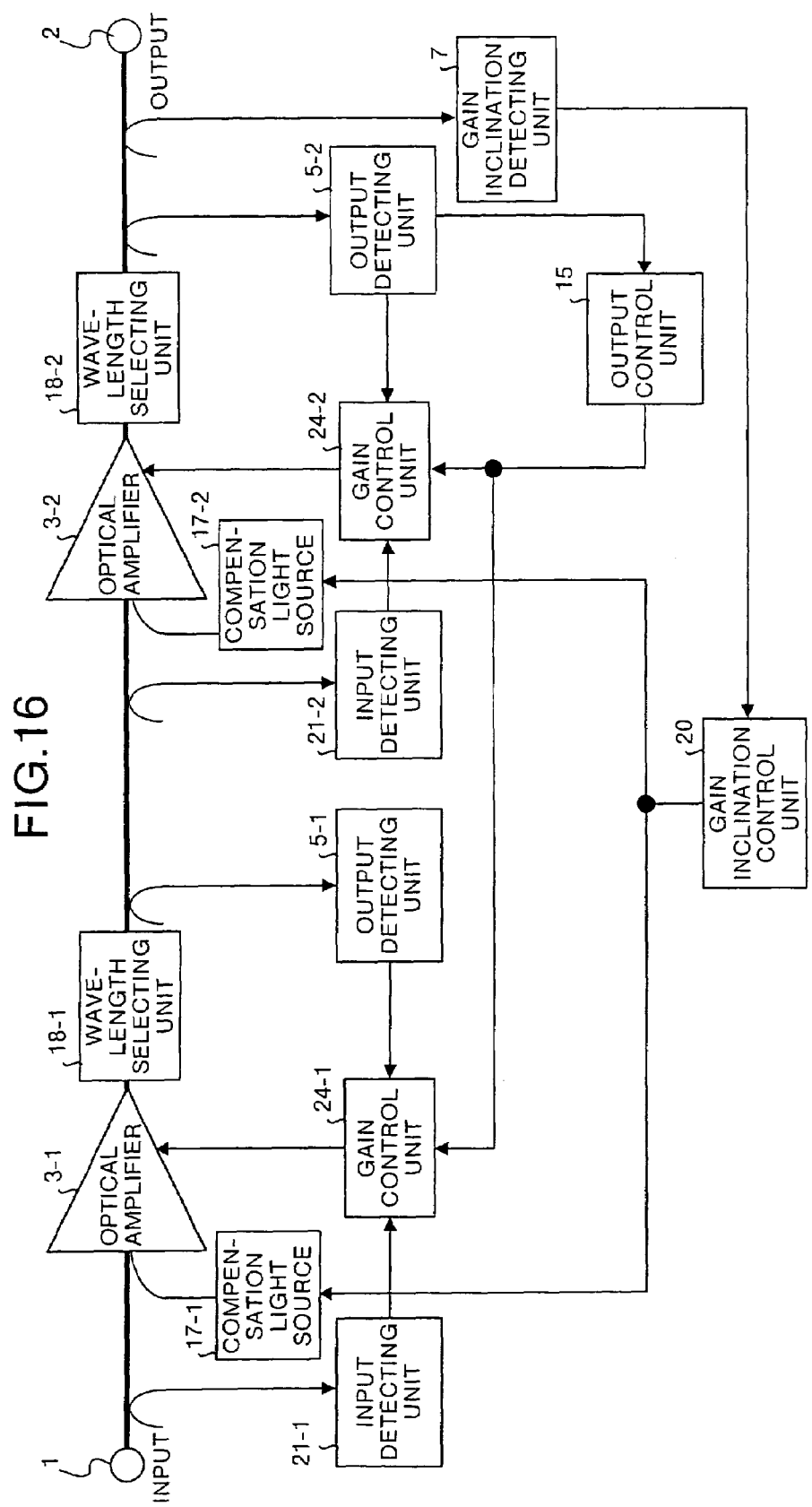
FIG. 16 is a diagram showing a structure of a twelfth embodiment of an optical amplifier apparatus according to the present invention.
Figure 17:
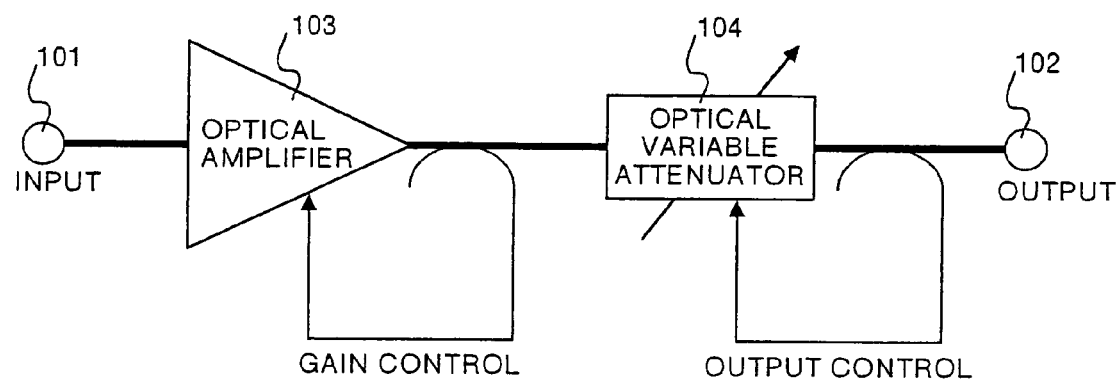
FIG. 17 is a diagram showing an example of a conventional structure of an optical amplifier apparatus.

Twelfth Embodiment:

FIG. 16 shows a twelfth embodiment of an optical amplifier apparatus according to the present invention.

The optical amplifier apparatus of the twelfth embodiment has the first and second optical amplifiers 3-1 and 3-2, the first and second compensation light sources 17-1 and 17-2, the first and second wavelength selecting units 18-1 and 18-2, the output detecting units 5-1 and 5-2, the output control unit 15, the gain inclination detecting unit 7, the gain inclination control unit 20, the input detecting units 21-1 and 21-2, and the gain control units 24-1 and 24-2. The reference number 1 denotes the input terminal, and 2 denotes the output terminal.

The output detecting unit 5-2 detects an output level of a wavelength-multiplexed signal light at an output side of the second wavelength selecting unit 18-2, and outputs a detection value to the output control unit 15. The output control unit 15 controls output lights of excitation light sources of the first optical amplifier 3-1 and the second optical amplifier 3-2 according to the detection value so that the output level detected by the output detecting unit 5-2 becomes constant. The gain inclination detecting unit 7 detects a gain inclination from an output of the second wavelength selecting unit 18-2, and outputs a detection value to the gain inclination control unit 20. The gain inclination control unit 20 controls the gain inclination to an optimum value by adjusting output lights of the first compensation light source 17-1 and the second compensation light source 17-2 according to a gain inclination (a detection value) detected by the gain inclination detecting unit 7.

Therefore, in this twelfth embodiment also, like in the first embodiment, it is possible to realize an optical amplifier apparatus capable of controlling the gain inclination as well as making constant the optical output level, in the amplification of a wavelength-multiplexed signal light.

As can be understood from the above explanation, according to one aspect of the present invention, the output control unit controls an output level of the optical amplifier according to an output level detected by the output detecting unit. The gain inclination control unit controls a gain inclination of the optical amplifier according to a gain inclination detected by the gain inclination detecting unit. Therefore, it is possible to realize an optical amplifier apparatus capable of controlling the gain inclination as well as making constant the optical output level, in the amplification of a wavelength-multiplexed signal light.

According to another aspect of the invention, the output control unit controls the attenuation of an output signal light attenuated by the optical variable attenuator according to an output level detected by the output detecting unit. The gain inclination control unit controls a gain inclination by adjusting an output light of an excitation light source of the optical amplifier according to a gain inclination detected by the gain inclination detecting unit. Therefore, it is possible to realize an optical amplifier apparatus capable of controlling the gain inclination as well as making constant the optical output level, in the amplification of a wavelength-multiplexed signal light.

According to still another aspect of the invention, the output control unit controls an output light of an excitation light source of the optical amplifier according to an output level detected by the output detecting unit. The gain inclination control unit controls a gain inclination by adjusting the attenuation of an output signal light attenuated by the optical variable attenuator according to a gain inclination detected by the gain inclination detecting unit. Therefore, it is possible to realize an optical amplifier apparatus capable of controlling the gain inclination as well as making constant the optical output level, in the amplification of a wavelength-multiplexed signal light.

According to still another aspect of the invention, the output control unit controls an output light of the compensation light source according to an output level detected by the output detecting unit. The gain inclination control unit adjusts an output light of an excitation light source of the optical amplifier according to a gain inclination detected by the gain inclination detecting unit. Therefore, it is possible to realize an optical amplifier apparatus capable of controlling the gain inclination as well as making constant the optical output level, in the amplification of a wavelength-multiplexed signal light.

According to still another aspect of the invention, the output control unit controls an output light of an excitation light source of the optical amplifier according to an output level detected by the output detecting unit. The gain inclination adjusts an output light of the compensation light source according to a gain inclination detected by the gain inclination detecting unit. Therefore, it is possible to realize an optical amplifier apparatus capable of controlling the gain inclination as well as making constant the optical output level, in the amplification of a wavelength-multiplexed signal light.

According to still another aspect of the invention, the output control unit controls the attenuation of an output signal light of the optical variable attenuator according to an output level detected by the output detecting unit. The gain inclination control unit adjusts an output light of the compensation light source according to a gain inclination detected by the gain inclination detecting unit. Therefore, it is possible to realize an optical amplifier apparatus capable of controlling the gain inclination as well as making constant the optical output level, in the amplification of a wavelength-multiplexed signal light.

According to still another aspect of the invention, the output control unit controls an output light of the compensation light source according to an output level detected by the output detecting unit. The gain inclination control unit controls a gain inclination by adjusting the attenuation of an output signal light attenuated by the optical variable attenuator according to a gain inclination detected by the gain inclination detecting unit. Therefore, it is possible to realize an optical amplifier apparatus capable of controlling the gain inclination as well as making constant the optical output level, in the amplification of a wavelength-multiplexed signal light.

According to still another aspect of the invention, the output control unit controls the attenuation of an output signal light attenuated by the optical variable attenuator according to an output level detected by the output detecting unit. The gain inclination control unit controls a gain inclination by adjusting output lights of excitation light sources of the first optical amplifier and the second optical amplifier according to a gain inclination detected by the gain inclination detecting unit. Therefore, it is possible to realize an optical amplifier apparatus capable of controlling the gain inclination as well as making constant the optical output level, in the amplification of a wavelength-multiplexed signal light.

According to still another aspect of the invention, the output control unit controls output lights of excitation light sources of the first optical amplifier and the second optical amplifier according to an output level detected by the output detecting unit. The gain inclination control unit controls a gain inclination by adjusting the attenuation of an output signal light attenuated by the optical variable attenuator according to a gain inclination detected by the gain inclination detecting unit. Therefore, it is possible to realize an optical amplifier apparatus capable of controlling the gain inclination as well as making constant the optical output level, in the amplification of a wavelength-multiplexed signal light.

According to still another aspect of the invention, the output control unit controls the attenuation of an output signal light attenuated by the optical variable attenuator according to an output level detected by the output detecting unit. The gain inclination control unit controls a gain inclination by adjusting an output light of the compensation light source according to a gain inclination detected by the gain inclination detecting unit. Therefore, it is possible to realize an optical amplifier apparatus capable of controlling the gain inclination as well as making constant the optical output level, in the amplification of a wavelength-multiplexed signal light.

According to still another aspect of the invention, the output control unit controls an output light of the compensation light source according to an output level detected by the output detecting unit. The gain inclination control unit controls a gain inclination by adjusting the attenuation of an output signal light attenuated by the optical variable attenuator according to a gain inclination detected by the gain inclination detecting unit. Therefore, it is possible to realize an optical amplifier apparatus capable of controlling the gain inclination as well as making constant the optical output level, in the amplification of a wavelength-multiplexed signal light.

According to still another aspect of the invention, the output control unit controls output lights of excitation light sources of the first optical amplifier and the second optical amplifier according to an output of the output detecting unit. The gain inclination control unit controls a gain inclination by adjusting an output light of the compensation light source according to a gain inclination detected by the gain inclination detecting unit. Therefore, it is possible to realize an optical amplifier apparatus capable of controlling the gain inclination as well as making constant the optical output level, in the amplification of a wavelength-multiplexed signal light.

According to still another aspect of the invention, the output control unit controls an output light of the compensation light source according to an output level detected by the output detecting unit. The gain inclination control unit controls a gain inclination by adjusting output lights of an excitation light source of the first optical amplifier and an excitation light source of the second optical amplifier according to a gain inclination detected by the gain inclination detecting unit. Therefore, it is possible to realize an optical amplifier apparatus capable of controlling the gain inclination as well as making constant the optical output level, in the amplification of a wavelength-multiplexed signal light.

Moreover, the gain inclination detecting unit branches a wavelength-multiplexed signal light, and detects a gain inclination from optical signal levels of a shortest wave and a longest wave. Therefore, it is possible to properly detect the gain inclination.

Furthermore, the gain inclination detecting unit branches a wavelength-multiplexed signal light, and detects a gain inclination from optical signal levels of three or more waves. Therefore, it is possible to properly detect the gain inclination.

Moreover, the gain inclination detecting unit detects frequency components superimposed on the optical signals of respective wavelengths thereby to detect a gain inclination. Therefore, it is possible to properly detect the gain inclination.

Furthermore, the gain inclination detecting unit detects frequency components superimposed on the optical signals thereby to detect a gain inclination. Therefore, it is possible to properly detect the gain inclination.

INDUSTRIAL APPLICABILITY

As explained above, the optical amplifier apparatus according to the present invention is suitable for application to an optical repeater and the like for wavelength multiplex transmission.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An optical amplifier apparatus comprising:
   a first optical amplifier which amplifies an input wavelength-multiplexed signal light;

an optical variable attenuator which attenuates an output signal light of said first optical amplifier;

a second optical amplifier which amplifies an output signal light of said optical variable attenuator;

an output detecting unit which detects an output level at an output side of said second optical amplifier;

an output control unit which controls output lights of excitation light sources of said first optical amplifier and said second optical amplifier according to an output level detected by said output detecting unit;

a gain inclination detecting unit which detects a gain inclination of said second optical amplifier; and a gain inclination control unit which controls a gain inclination by adjusting the attenuation of an output signal light attenuated by said optical variable attenuator according to a gain inclination detected by said gain inclination detecting unit.

2. The optical amplifier apparatus according to claim 1, wherein said gain inclination detecting unit branches a wavelength-multiplexed signal light, and detects a gain inclination from optical signal levels of a shortest wave and a longest wave.

3. The optical amplifier apparatus according to claim 1, wherein said gain inclination detecting unit branches a wavelength-multiplexed signal light, and detects a gain inclination from optical signal levels of three or more waves.

4. The optical amplifier apparatus according to claim 1, wherein said optical amplifier apparatus inputs a wavelength-multiplexed signal light having mutually different frequency components superimposed on optical signals of a shortest wave and a longest wave respectively, and said gain inclination detecting unit detects frequency components superimposed on the optical signals of respective wavelengths thereby to detect a gain inclination.

5. The optical amplifier apparatus according to claim 1, wherein said optical amplifier apparatus inputs a wavelength-multiplexed signal light having mutually different frequency components superimposed on optical signals of three or more waves respectively, and said gain inclination detecting unit detects frequency components superimposed on the optical signals thereby to detect a gain inclination.

* * * * *